(12) United States Patent
Patlolla et al.

(10) Patent No.: US 11,804,378 B2
(45) Date of Patent: Oct. 31, 2023

(54) SURFACE CONVERSION IN CHEMICAL MECHANICAL POLISHING

(71) Applicant: International Business Machines Corporation, Armonk, NY (US)

(72) Inventors: Raghuveer R Patlolla, Guilderland, NY (US); Donald F Canaperi, Bridgewater, CT (US); Cornelius Brown Peethala, Slingerlands, NY (US); Chih-Chao Yang, Glenmont, NY (US); Mary Breton, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 17/566,908

(22) Filed: Dec. 31, 2021

(65) Prior Publication Data
US 2023/0215734 A1 Jul. 6, 2023

(51) Int. Cl.
*H01L 21/31* (2006.01)
*H01L 21/3105* (2006.01)
*H01L 21/321* (2006.01)
*H01L 21/02* (2006.01)

(52) U.S. Cl.
CPC .. *H01L 21/31053* (2013.01); *H01L 21/02074* (2013.01); *H01L 21/3212* (2013.01)

(58) Field of Classification Search
CPC ......... H01L 21/31053; H01L 21/02074; H01L 21/3212
USPC .................................................. 438/690–693
See application file for complete search history.

(56) References Cited

U.S. PATENT DOCUMENTS

| | | | |
|---|---|---|---|
| 6,342,444 B1 * | 1/2002 | Higashi | H01L 21/76858 438/653 |
| 2010/0216309 A1 | 3/2010 | Minami | |
| 2013/0078778 A1 * | 3/2013 | Chien | H01L 29/66795 438/296 |
| 2019/0096842 A1 * | 3/2019 | Fountain, Jr. | H01L 24/03 |

FOREIGN PATENT DOCUMENTS

| | | | | |
|---|---|---|---|---|
| KR | 20110028446 A | 3/2011 | | |
| WO | WO-2018043440 A1 * | 3/2018 | ......... | C11D 11/0029 |

* cited by examiner

*Primary Examiner* — Duy Vu N Deo
(74) *Attorney, Agent, or Firm* — Jeffrey S LaBaw; L. Jeffrey Kelly

(57) ABSTRACT

A method for fabricating a planarized planarization layer for an integrated circuit device is described. A barrier layer is deposited over a planarization layer. Next, a liner layer is deposited on the barrier layer. An overburden layer is deposited on the liner layer. A first chemical mechanical polishing (CMP) process is performed on the overburden layer. A surface conversion process is performed on uncovered portions of a top surface of the planarization layer which are not protected by the polished overburden layer. A first wet etch is performed of the planarization layer. In embodiments, the first wet etch is selective to metal overburden layer as compared to the planarization layer. A second wet etch is performed removing the liner layer, the diffusion barrier layer and the metal overburden layer. In embodiments, the second wet etch is selective to the planarization layer as compared to the overburden layer.

20 Claims, 10 Drawing Sheets

PRIOR ART

US 11,804,378 B2

SURFACE CONVERSION IN CHEMICAL MECHANICAL POLISHING

BACKGROUND

This disclosure relates to integrated circuit devices, and more specifically, to a method and structure to improve within chip uniformity for chemical mechanical polishing processes for producing semiconductor devices.

In semiconductor chips, the devices fabricated in or on a semiconductor substrate are connected with a metallic interconnection structure made of metal lines and "vias" which interconnect the metal lines. The metal lines are arranged in horizontal layers, i.e., parallel to the substrate, and separated by layers of dielectrics while vias are disposed vertically in openings in the dielectric to interconnect the layers of metal lines. Because of the desire to smooth the topology of the layers which comprise the semiconductor device, it is common to planarize one or more layers of the wafer during fabrication. The most widely used planarization processes is chemical mechanical polishing (CMP) which was developed at IBM in the 1980s and has played a key role for integrated circuit manufacturing for several decades.

One of the problems with CMP is that the goal of planarization, to perfectly planarize the surface, is very difficult when the topology is extreme and when the CMP process must stop in the same layer that it is planarizing. This problem is compounded when different areas of the chip and wafer have very different respective topologies underlying the layer to be planarized. Without a stop layer, the choice is usually made to stop the CMP prior to producing a perfectly planar layer to avoid removing some of the underlying layers.

Thus, improving the planarization using a chemical mechanical polishing process of a semiconduction structure is desirable. The present disclosure presents a method and structure to address the above described problem.

SUMMARY

According to this disclosure, a method for fabricating a planarized planarization layer for an integrated circuit device is described. A barrier layer is deposited over a planarization layer. Next, a liner layer is deposited on the barrier layer. An overburden layer is deposited on the liner layer. A first chemical mechanical polishing (CMP) process is performed on the overburden layer. A surface conversion process is performed on uncovered portions of a top surface of the planarization layer which are not protected by the polished overburden layer. A first wet etch is performed of the planarization layer. In embodiments, the first wet etch is selective to metal overburden layer as compared to the planarization layer. A second wet etch is performed removing the liner layer, the diffusion barrier layer and the metal overburden layer. In embodiments, the second wet etch is selective to the planarization layer as compared to the overburden layer.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
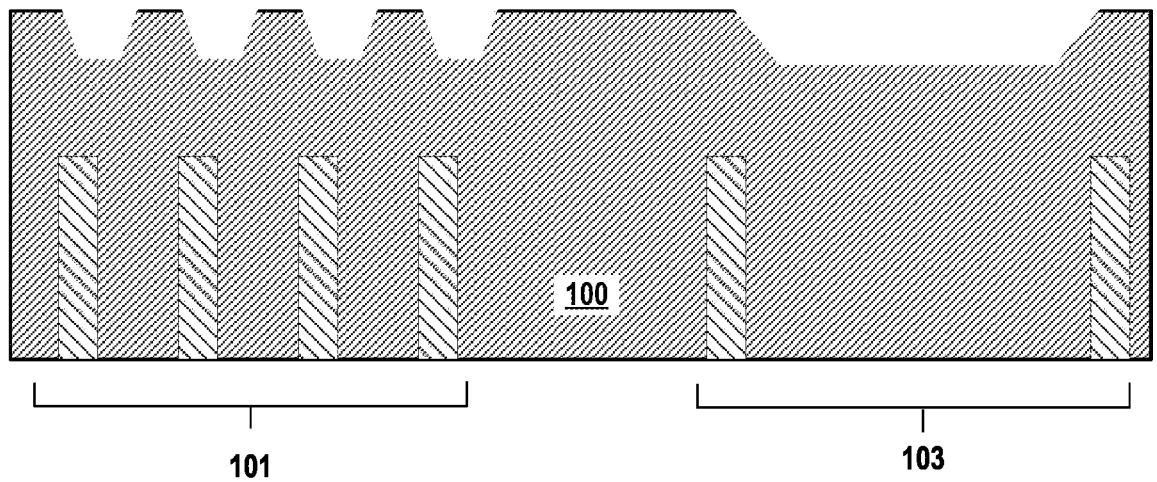
FIG. 1 is a cross-sectional diagram depicting a prior art structure before and after planarizing a planarization layer of a semiconductor device illustrating the problem experienced by the prior art.
Figure 1:
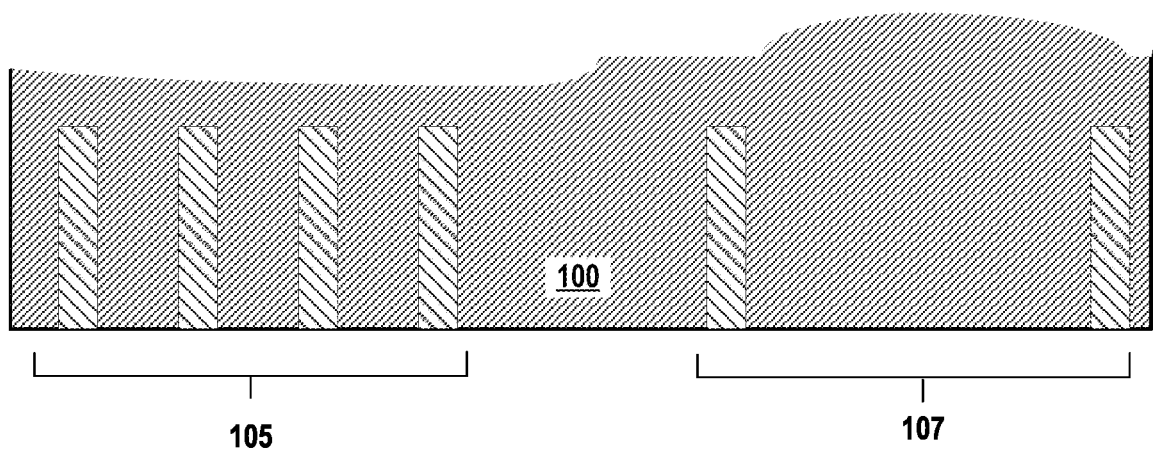

At a high level, embodiments of the invention provide a chemical mechanical polishing (CMP) process which provides improved planarization and within chip uniformity for wafers in which the variation between topology in different areas of the chip varies widely. The invention uses an overburden layer over the planarization layer and a succession of different CMP and etch processes to planarize the planarization layer. In embodiments of the invention, the overburden layer is copper and the planarization layer is an interlayer dielectric (ILD) layer such as silicon dioxide. In intermediate steps of the process, metal "islands" are formed in the recesses of the top surface of the ILD layer leaving some of the top surface of the ILD layer uncovered.

As implied by its name, CMP is a process in which chemical and mechanical components work together to improve the removal of material from the semiconductor wafer. In CMP, a polisher applies a downward force on a polishing pad containing a slurry contacting a patterned (usually) semiconductor wafer. In a typical process, both the polisher and wafer move in directions relative to one another to generate the movement needed for polishing the wafer surface. Slurries are composed of abrasive particles, oxidizers, organic compounds such as dispersant and passivation agents, and deionized water (DIW). Specific slurry formulations are selected depending on the surface materials to be polished. A slurry may be selective, meaning that it etches some materials faster than others, or non-selective, meaning that it etches the materials on the substrate surface substantially at the same rate. The physical and chemical properties of the slurry that have a significant influence on the performance of the CMP process.

Unlike some prior art methods like a timed polish, the inventive process is not dependent on the underlying topology of the layers to achieve a nearly planarized layer. In the prior art, where there is large variation in topology, the planarity of the planarized layer typically exhibits areas of high and low thickness, resulting in non-uniformity across the chip and wafer. That is, there is a large pattern dependency in the typical CMP process. A single step CMP process cannot stop reliably in the same layer, i.e., without any stop layer.

One prior art CMP method called Advanced Process Controlled (APC) polish uses optimized consumables can stop reliably with in the planarized layer but will not control the overall planarity with large variances in the uniformity of the underlying structures. Successful implementation of APC is a tedious process that needs reliable wafer history, frequent head dependent tool quality rate data and many resources.

In the following text, the "planarization layer" refers to the layer to be planarized, the current permanent layer being planarized and the completed, planarized layer depending on the state of the process. In preferred embodiments, the planarization layer is a dielectric layer. However, in other embodiments of the invention, other materials are used as the planarization layer.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

Aspects of the present invention will be described in terms of a given illustrative embodiment; however, other embodiments which include other structures, substrates, materials and process features and steps can be varied within the scope of aspects of the present invention.

When an element such as a layer, region or substrate is referred to as being "over" another element, it can be directly on the other element or intervening elements can also be present. In contrast, when an element is referred to as being "on", "directly on", "directly over" or "contacting" another element, there are no intervening elements present. When an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Those skilled in the art will appreciate that descriptions in the specification to an embodiment means that a particular feature, structure, characteristic, is included in at least one embodiment, but not all embodiments. The phrase "in an embodiment", as well any other variations, appearing in various places throughout the specification are not necessarily all referring to the same embodiment.

Embodiments will be explained below with reference to the accompanying drawings.

FIG. 1 is a cross-sectional diagram depicting a prior art structure before and after planarizing a planarization layer of a semiconductor device illustrating the problem experienced by the prior art. In this drawing, the upper cross-section shows a structure before planarization and the lower cross-section shows the structure after planarization. Those skilled in the art will recognize that the illustration is highly simplified. In the upper cross-section, planarization layer 100 is to be planarized and is deposited over high density feature area 101 and low density feature area 103. In embodiments of the invention, the features in high density feature area 101 and low density feature are 103 are memory pillars, such as magnetic tunnel junction (MTJ) pillars. Planarization layer 100 can be a dielectric, e.g., an interlayer dielectric (ILD) layer. Due to the underlying topology, recesses and ridges are formed, i.e., topology, in the top surface of the ILD layer. While the topology of the planarization layer is less extreme than that of the underlying substrate, the goal of the planarization process is to create a planar flat top surface of the planarization layer 100, i.e., without the ridges and recesses. However, as shown in the lower cross-section, after the planarization process, the planarization layer 100' is not totally planar. In this illustration, the planarization layer 100' over the high density feature area 101 has a lower height than the planarization layer 100' over the low density feature area 103. To avoid an overetch of respective underlying layers in respective topology areas, the prior art CMP process stops before complete planarity can be attained.

Figure 2:
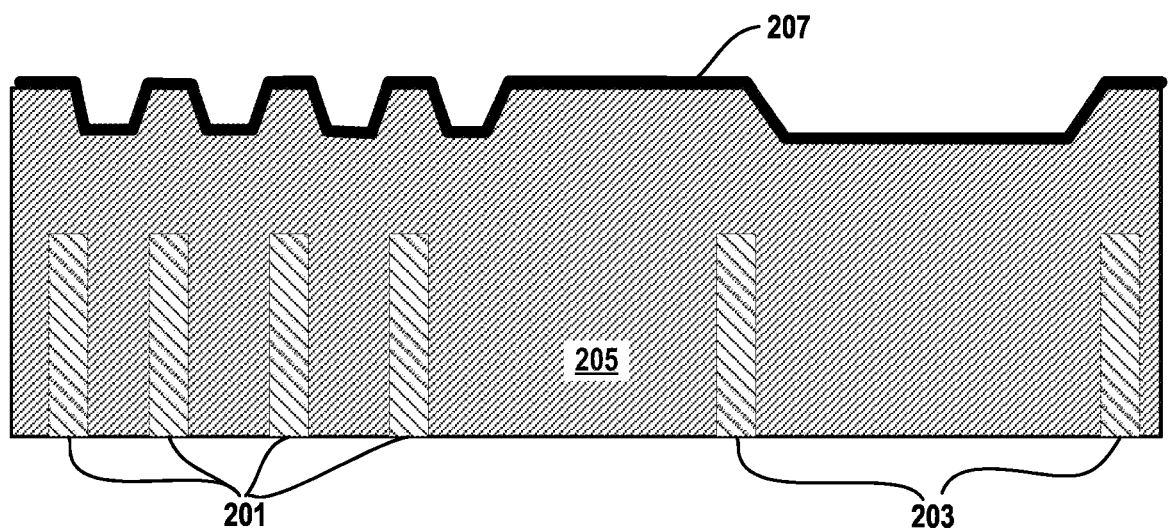
FIG. 2 is a cross-sectional diagram depicting the structure in an intermediate stage according to an embodiment of the invention.

FIG. 2 is a cross-sectional diagram depicting the structure in an intermediate stage according to an embodiment of the invention. Features in high density feature area 201 and features in the low density feature area 203 provide differing topology under the planarization layer 205 to be planarized. The features in high density feature area 201 and low density feature area 203 are multilayered elements in some embodiments of the invention, e.g., a contact structure and MTJ stack. In other embodiments, they are a single layer of material, e.g., silicon, as illustrated. In preferred embodiments, dielectric layer 205 is Silicon-Oxygen-Carbon-Nitride (SiOCN). In other embodiments, other dielectrics are used such as such silicon dioxide ($SiO_2$), silicon nitride (SiN), silicon carbide (SiC), or low-k dielectric materials. The dielectric can be deposited with known processes such as physical vapor deposition (PVD). The top surface of the dielectric layer 205 will conform to some degree to the underlying topology. Note that the top surface of the layer 205 has a different topology over the high density feature area 201 as compared to the topology over the low density feature area 203. The planarization layer 205 will be thicker in overall thickness than the tallest features in the underlying topology in preferred embodiments as it is generally undesirable to expose these underlying features during the CMP process.

Also shown in FIG. 2, is a barrier layer 207 which serves as an optional barrier and adhesion layer. Copper (Cu) is used as an overburden layer in future steps of certain preferred embodiments of the invention and benefits from a barrier layer on top of the dielectric. Other embodiments which use other materials as the overburden layer do not need a barrier layer. In certain embodiments using copper, the barrier layer 207 is made from tantalum nitride (TaN). Tantalum nitride prevents Cu diffusion into the dielectric of which the planarization layer 205 is composed as well as being a well-known substrate for a subsequent a Cu deposition. Other known barrier layers such as titanium nitride (TiN) are used in other embodiments of the invention. The barrier layer 207 can be deposited with known processes such as physical vapor deposition (PVD).

A diffusion barrier layer or adhesion layer is not needed when the metal used for the overburden layer in subsequent steps does not diffuse into the dielectric and has good adhesion to the dielectric. Although diffusion of the copper in the dielectric takes time, the primary purpose of barrier layer is to provide adhesion to the dielectric when using Cu as the overburden layer. Copper has good properties in a CHIP process and so is a good choice in embodiments of the invention. A TaN layer helps provide a stable surface for the Cu layer. In embodiments of the invention, the barrier layer 207 ranges from 20 to 50 Angstroms in thickness.

In some embodiments, e.g., those where the planarization layer 205 to be planarized is an interlayer dielectric layer, an optional partial ILD fill is performed first, followed by the diffusion barrier layer deposition. Other embodiments using other materials for the planarization layer 205 would use compatible materials for the optional partial fill process.

Figure 3:
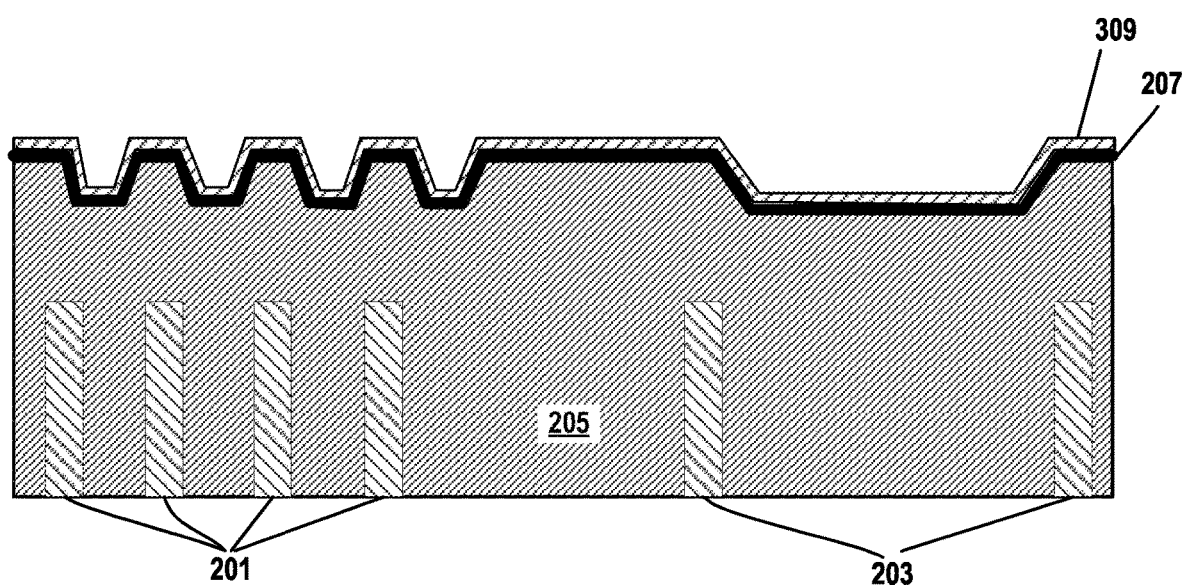
FIG. 3 is a cross-sectional diagram depicting the structure after a liner deposition according to an embodiment of the invention.

FIG. 3 is a cross-sectional diagram depicting the structure after a liner deposition according to an embodiment of the invention. The liner layer 309 is used to improve the Cu deposition and reflow on the barrier layer. While a variety of liner, seed and/or "seed assist" layers are known to the art, in preferred embodiments, ruthenium (Ru) and/or cobalt (Co) liners are used to support the subsequent Cu reflow. Other liner layers may be substituted both for embodiments which use a Cu overburden layer 411 and in other embodiments which replace Cu with another metal for the overburden layer 411. The liner layer 309 is not mandatory; however, the inventors have found in practice that the additional process step is worthwhile to improve the Cu reflow over small features in the top surface of the planarization layer to be planarized. In embodiments of the invention, a PVD deposited seed layer can be used prior to electroplating the Cu overburden layer. In embodiments of the invention, the liner layer 309 ranges from 20 to 50 Angstroms in thickness.

Figure 4:
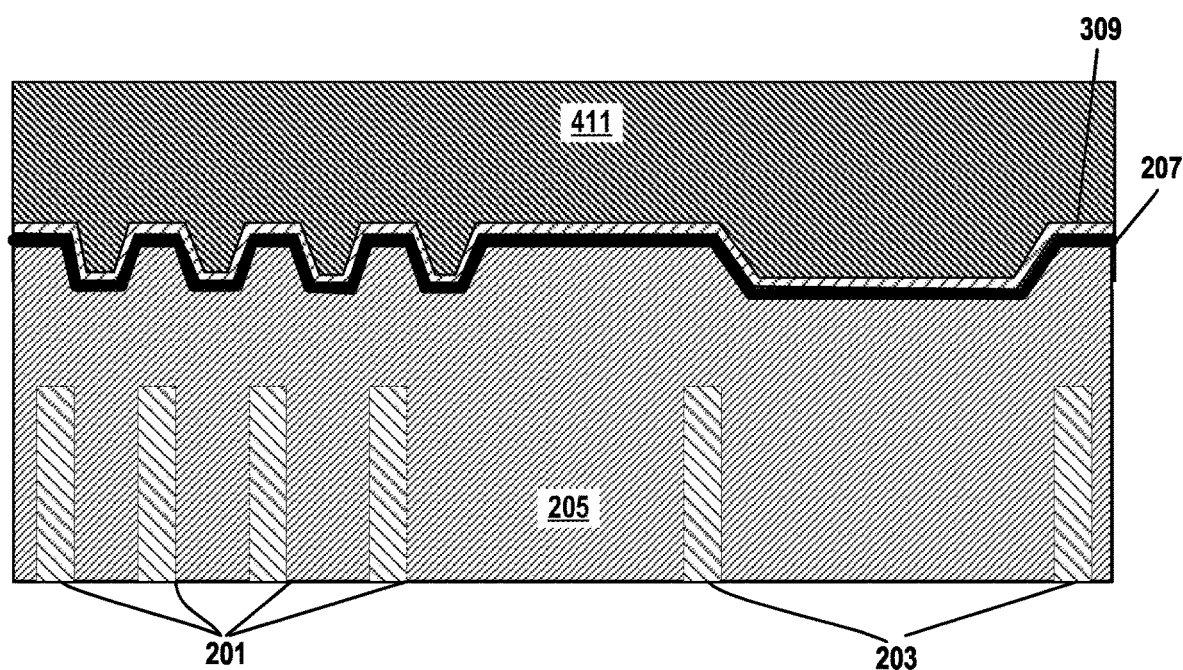
FIG. 4 is a cross-sectional diagram depicting the structure after a copper (Cu) layer deposition according to an embodiment of the invention.

FIG. 4 is a cross-sectional diagram depicting the structure after a copper (Cu) or Cu alloy layer deposition according to an embodiment of the invention. Cu is used as the overburden layer 411 because it is a well understood material with good etch and polishing characteristics. Other metals such as cobalt (Co) are used in different embodiments of the invention. In embodiments of the invention, the Cu overburden layer 411 ranges from 4000 to 20000 Angstroms in thickness. Preferably, the overburden layer 411 has different etch properties than the planarization layer 205. Copper and copper alloys are well known metals used commonly in semiconductor fabrication. An "overburden" layer is created when the deposition process deposits more material than is needed in a final structure. In the present invention, the overburden layer 411 is used to create a planar top surface which will be used in subsequent steps to ultimately planarize planarization layer 205. The deposition thickness of the overburden layer 411 will depend on the variations of topology of the underlying layers as translated to the topology of the top surface of the planarization layer. In embodiments of the invention, the deposition thickness of overburden layer 411 will be at least as thick as the depth of the recesses in the top surface of the dielectric planarization layer 205. While the overburden layer 411 will serve to provide a more planar top surface, it is not necessary that a totally planar layer be created as subsequent steps also contribute to achieving planarity.

Figure 5:
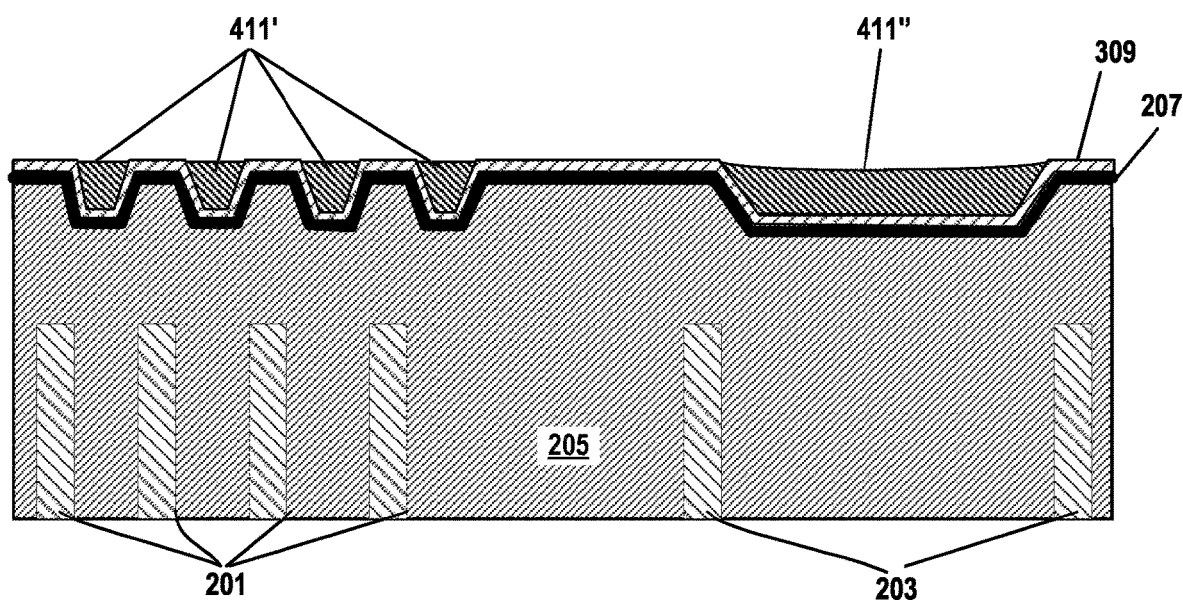
FIG. 5 is a cross-sectional diagram depicting the structure after a copper layer chemical mechanical polishing (CMP) process according to an embodiment of the invention.

FIG. 5 is a cross-sectional diagram depicting the structure after a copper layer chemical mechanical polishing (CMP) process according to an embodiment of the invention. Within chemical mechanical polishing processes, there are selective processes which remove certain layers preferentially with respect to other layers and nonselective processes which tend to remove all layers more or less equally. In embodiments of the invention, a Cu preferential CMP process is used to remove most of the thick Cu overburden layer. A Cu preferential CMP process allows the process to use the barrier layer 207, liner layer 309 or the planarization layer 205 as a stop layer, improving the process latitude. As shown in the drawing, the Cu layer has mostly been polished away, forming a set of "islands" 411', 411" of the overburden layer in recesses of the planarization layer 205 bridged by the liner layer 309 and the barrier layer 207 in the field areas. Some islands 411" over the low density feature area 203 are larger than the islands 411' over the high density feature area 201. Though the drawing shows the liner layer 309 and the barrier layer 207 as completely intact, depending on the underlying topology, some of these layers may be polished away between some Cu islands 411', 411" uncovering portions of the planarization layer. Note that the overburden layer may be "dished" in some of the overburden islands 411" after this step.

Figure 6:
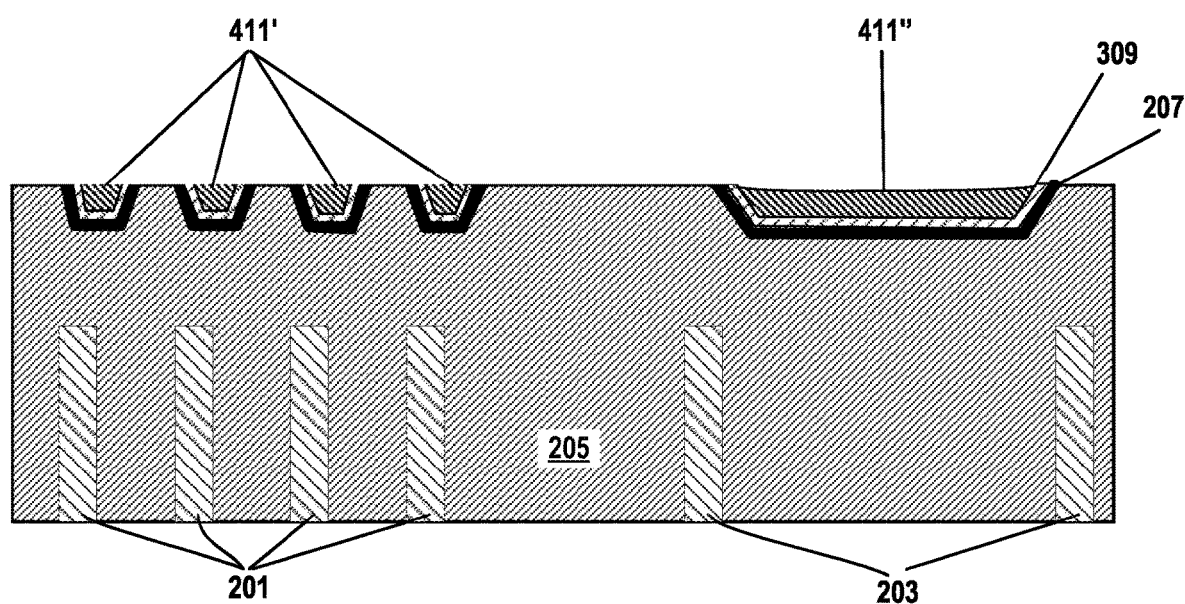
FIG. 6 is a cross-sectional diagram depicting the structure after a nonselective layer chemical mechanical polishing (CMP) "buff" process according to an embodiment of the invention.

FIG. 6 is a cross-sectional diagram depicting the structure after a nonselective chemical mechanical polishing (CMP) "buff" process according to an embodiment of the invention. The "buff" CMP uses a non-selective slurry to clear the Cu residuals and clear the liner layer 309 and barrier layer 207 in the field areas which have not already been polished away by Cu preferential CMP process discussed above. As is known to those skilled in the art, non-selective CMP processes are used to remove material thicknesses equally across the chip and/or wafer. In the present step, it is used to uncover portions of the top surface of the dielectric planarization layer 205 for subsequent processing. As shown, the Cu islands 411', 411" are bounded by the uncovered top surface. A "buff" CMP process commonly refers to a CMP process where a relatively small amount of material is removed. In this embodiment, the "buff" CMP process would remove 1 to 5 nm of material to uncover the planarization layer 205 around the islands 411', 411".

Figure 7:
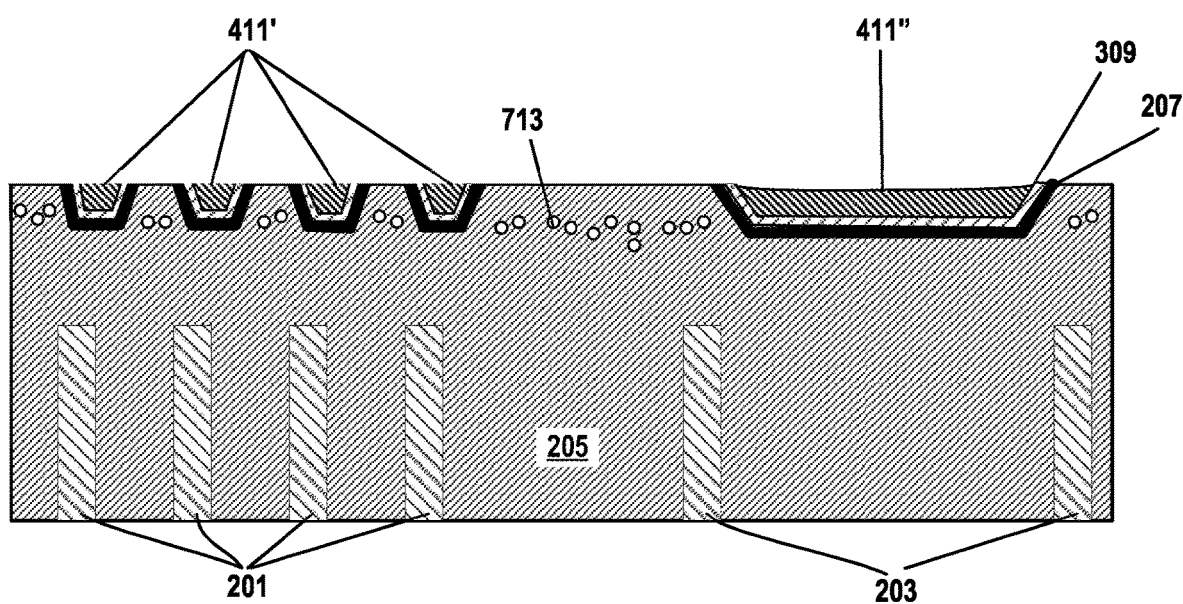
FIG. 7 is a cross-sectional diagram depicting the structure after a plasma process according to an embodiment of the invention.

FIG. 7 is a cross-sectional diagram depicting the structure after a surface conversion process according to an embodiment of the invention. In embodiments of the invention, the surface conversion process converts the uncovered portions of the planarization layer into a top layer which is more easily etched by a wet etch than process than covered, unconverted portions of the planarization layer. The plasma process is used as a surface conversion process, since in its deposited state the SiOCN dielectric planarization layer 205 is not easily wet etched. However, once the top layer has been converted using plasma damage (this will release the carbon in the layer), the top layer 713 can be easily wet etched. In embodiments of the invention, a plasma or ashing process using an N2/H2 plasma can create the desired damage. In general, the damaged portions of top layer of dielectric should be approximately the same depth as the metal islands left on top of the dielectric at this stage of the process. The metal islands 411', 411" protect some areas of the planarization layer from damage or conversion. The dots in top layer 713 indicate the damaged areas of the dielectric planarization layer 205. These areas undergo both physical and chemical changes. Other embodiments of the invention which use other materials as the planarization layer 205 use other surface treatments to convert the uncovered portions of the layer into a material which can be etched.

Figure 8:
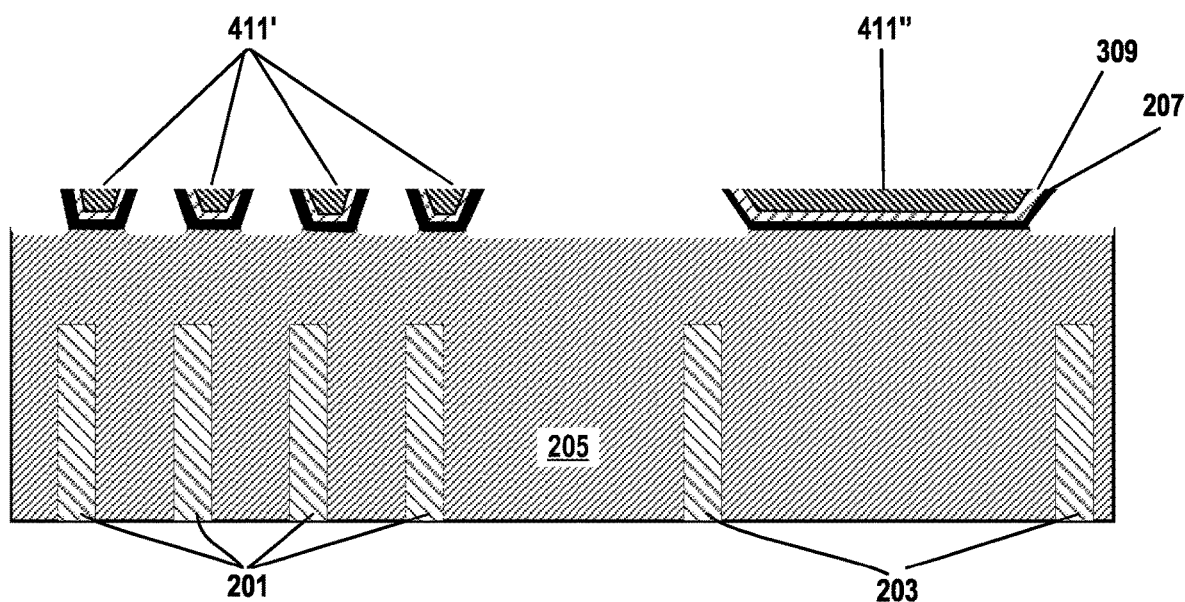
FIG. 8 is a cross-sectional diagram depicting the structure after an etch process according to an embodiment of the invention.

FIG. 8 is a cross-sectional diagram depicting the structure after an etch process according to an embodiment of the invention. As shown in this drawing, the damaged ILD top layer has been removed. In embodiments of the invention, the wet etch is "selective" to metal, meaning that the damaged dielectric layer is etched at a greater rate than the metal features. One known selective wet etch for dielectric versus metal is a diluted hydrofluoric acid (dHF) etch. Other selective wet etches are known to the art and are used in alternative embodiments of the invention.

Figure 9:
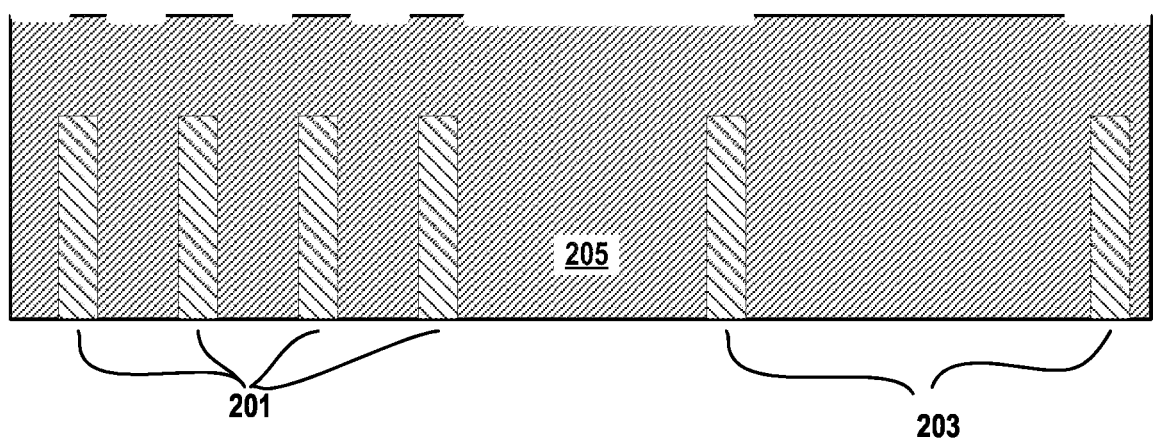
FIG. 9 is a cross-sectional diagram depicting the structure after a selective etch process according to an embodiment of the invention.

FIG. 9 is a cross-sectional diagram depicting the structure after a selective etch process according to an embodiment of the invention. In an embodiment, a wet etch of the metal islands (i.e., Cu/TaN/Ru/Co) selective to the ILD layer (the planarization layer 205) for a metal etch. For this combination of layers, a wet etch of hydrogen peroxide, carboxylic acid or an amino acid (for example glycolic acid) with a pH adjusting amount of potassium hydroxide (KOH) and buffer of boric acid ($H_3BO_3$) can be used. It is likely that there will be some undercut from the wet etch processes. Other selective wet etches are known to the art and are used in alternative embodiments of the invention.

Figure 10:
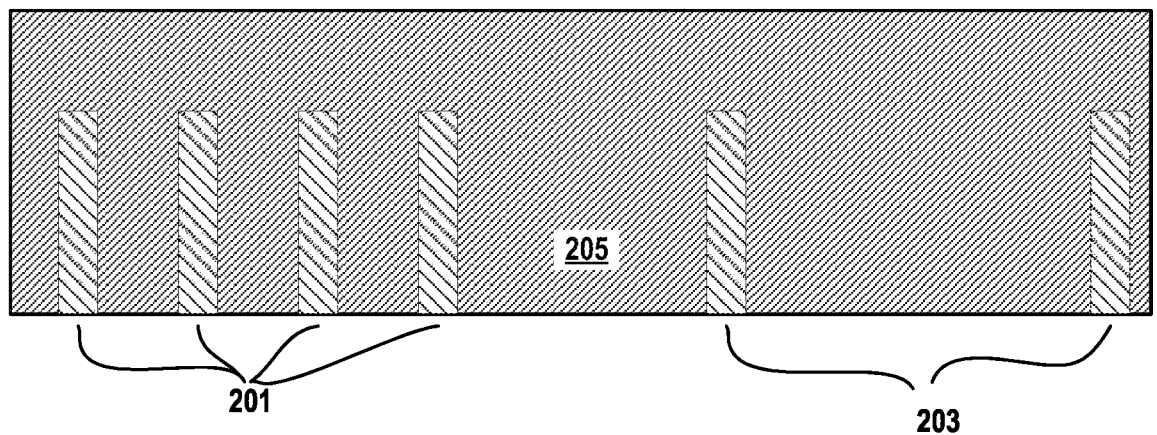
FIG. 10 is a cross-sectional diagram depicting the structure after a final chemical mechanical polishing (CMP) process according to an embodiment of the invention.

FIG. 10 is a cross-sectional diagram depicting the structure after a final touch up chemical mechanical polishing (CMP) process according to an embodiment of the invention. The final touch up CMP process for a final ILD film planarization is a very short touch up or "buff" CMP process used to planarize the top surface of the dielectric planarization layer 205 to fix the undercut left by the preceding steps. A similar "buff" CMP process which uses a non-selective slurry as discussed above in connection with FIG. 6 can be used in this step.

As is known to the art, the structure is followed by additional processing to fabricate contacts for structures which attach the chip to a packaging substrate so that the chip can be incorporated into a computing device. After completing the integrated circuits in the wafer, the wafer is diced and the individual chips are placed on their respective substrates.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only a limited number of features are illustrated in the drawings, those ordinarily skilled in the art would understand that many different types of features could be simultaneously formed with the embodiments herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating an integrated circuit device comprising:
    depositing a barrier layer over a planarization layer;
    depositing a liner layer on the barrier layer;
    depositing a metal overburden layer on the liner layer;
    performing a first chemical mechanical polishing (CMP) process on the metal overburden layer;
    uncovering portions of a top surface of the planarization layer, wherein some portions of the top surface of the planarization layer are covered by the metal overburden layer;
    performing a surface conversion process on uncovered portions of a top surface of the planarization layer;
    performing a first wet etch of the planarization layer, wherein the first wet etch is selective to the metal overburden layer as compared to the planarization layer; and performing a second wet etch of the liner layer, the barrier layer and the metal overburden layer wherein the second wet etch is selective to the planarization layer as compared to the metal overburden layer.

2. The method as recited in claim 1, wherein the barrier layer is selected from a group consisting of TaN and TiN.

3. The method as recited in claim 1, further comprising performing a partial fill deposition of a material used in the planarization layer followed by the depositing of the barrier layer.

4. The method as recited in claim 2, wherein the metal overburden layer comprises copper (Cu).

5. The method as recited in claim 1, wherein the liner layer is selected from a group consisting of ruthenium (Ru) and cobalt (Co).

6. The method as recited in claim 1, wherein the planarization layer is an interlayer dielectric layer.

7. The method as recited in claim 1, wherein the surface conversion process is an ashing or a plasma process, the planarization layer is a dielectric layer and the ashing or plasma process damages a top surface layer of the dielectric layer.

8. The method as recited in claim 1, further comprising performing a short CMP process to remove the liner layer, the barrier layer and the metal overburden layer over field areas of the planarization layer.

9. The method as recited in claim 1 further comprising performing a touch up CMP process to planarize the planarization layer performed after the first and second wet etches.

10. A method for fabricating an integrated circuit device comprising:
depositing an overburden layer over a planarization layer
performing a first chemical mechanical polishing (CMP) process on the overburden layer, creating a set of islands of the overburden layer on the planarization layer;
performing a surface conversion process on uncovered portions of the planarization layer;
performing a first wet etch of the planarization layer removing a converted top layer of the uncovered portions, exposing sidewalls of the set of islands and leaving unconverted portions of the planarization layer; and
performing a second wet etch of the overburden layer.

11. The method as recited in claim 10, further comprising:
depositing a barrier layer over the planarization layer;
depositing a liner layer on the barrier layer, wherein the overburden layer is deposited on the liner layer; and
using one of the planarization layer, the barrier layer and the liner layer as a stop layer in the first CMP process.

12. The method as recited in claim 11, further comprising:
performing a short CMP process to remove the liner layer, the barrier layer and the metal overburden layer over field areas of the planarization layer to uncover the uncovered portions of the planarization layer; and
performing a touch up CMP process to planarize the planarization layer performed after the first and second wet etches.

13. The method as recited in claim 11, wherein the planarization layer is a dielectric, the overburden layer is a metal, and the barrier layer and the liner layer are metals or metal nitrides.

14. The method as recited in claim 10, wherein the planarization layer is Silicon-Oxygen-Carbon-Nitride (SiOCN) and the overburden layer is copper or a copper alloy.

15. A method for fabricating an integrated circuit device comprising:
depositing an overburden layer over a planarization layer
performing a first chemical mechanical polishing (CMP) process on the overburden layer, creating a set of islands of the overburden layer on the planarization layer;
performing a surface conversion process on uncovered portions of the planarization layer, wherein the surface conversion process converts the uncovered portions of the planarization layer into a top layer which is etched at a greater rate by a first wet etch than covered, unconverted portions of the planarization layer;
performing the first wet etch of the planarization layer; and
performing a second wet etch of the overburden layer.

16. The method as recited in claim 15, wherein the planarization layer is SiOCN and the surface conversion process is an ashing or a plasma process.

17. The method as recited in claim 10, wherein a top surface of the planarization layer has a topology comprising a set of recesses and a deposition thickness of the overburden layer at least as thick as a depth of the recesses in the top surface of the planarization layer.

18. The method as recited in claim 10, wherein the overburden layer has different etch properties than the planarization layer.

19. The method as recited in claim 10, wherein the overburden layer is copper (Cu) or a copper alloy and the first CMP process is a Cu preferential CMP process.

20. The method as recited in claim 10, wherein the top layer is approximately a same depth as the set of islands on top of the planarization layer.

* * * * *